(12) United States Patent
Marrs et al.

(10) Patent No.: US 9,699,935 B1
(45) Date of Patent: Jul. 4, 2017

(54) EQUIPMENT CRADLES, RACK-MOUNTED EQUIPMENT SYSTEMS, AND RELATED METHODS

(71) Applicant: VCE Company, LLC, Richardson, TX (US)

(72) Inventors: Samuel Maxwell Marrs, Bradley, IL (US); Alva Benjamin Eaton, Nottingham Park, IL (US)

(73) Assignee: VCE IP HOLDING COMPANY LLC, Richardson, TX (US)

( * ) Notice: Subject to any disclaimer, the term of this patent is extended or adjusted under 35 U.S.C. 154(b) by 0 days.

(21) Appl. No.: 14/931,447

(22) Filed: Nov. 3, 2015

(51) Int. Cl.
    *A47F 7/00*      (2006.01)
    *H05K 7/18*      (2006.01)
    *H05K 7/14*      (2006.01)

(52) U.S. Cl.
    CPC .......... *H05K 7/183* (2013.01); *H05K 7/1488* (2013.01)

(58) Field of Classification Search
    CPC ............................ H05K 7/183; H05K 7/1488
    USPC ........ 211/26, 26.2; 312/334.13, 334.4, 334.5
    See application file for complete search history.

(56) References Cited

U.S. PATENT DOCUMENTS

| | | | | | |
|---|---|---|---|---|---|
| D33,335 | S | * | 10/1900 | Gallaway ........................ | 5/238 |
| 746,211 | A | * | 12/1903 | Webb ................... | A47C 23/062 |
| | | | | | 5/238 |
| 797,011 | A | * | 8/1905 | Mosier ................ | A47C 23/062 |
| | | | | | 5/238 |
| 972,755 | A | * | 10/1910 | Canio .......................... | 312/308 |
| 1,692,805 | A | * | 11/1928 | Andersson ............. | A47B 88/10 |
| | | | | | 312/334.13 |
| 1,906,832 | A | * | 5/1933 | Bales ................... | A47B 88/044 |
| | | | | | 312/333 |
| 2,031,251 | A | * | 2/1936 | Clark ..................... | A47B 88/10 |
| | | | | | 312/308 |
| 2,099,148 | A | * | 11/1937 | Tobey ................... | A47B 88/10 |
| | | | | | 312/334.13 |
| 2,343,692 | A | * | 3/1944 | Miller ................... | A47B 88/10 |
| | | | | | 312/333 |
| 2,386,757 | A | * | 10/1945 | Straubel ................. | A47B 88/10 |
| | | | | | 312/334.13 |
| 2,780,510 | A | * | 2/1957 | Cole, Jr. ................ | A47B 88/10 |
| | | | | | 312/334.13 |
| 2,981,584 | A | * | 4/1961 | Friend ................... | A47B 88/10 |
| | | | | | 312/334.13 |

(Continued)

*Primary Examiner* — Joshua J Michener
*Assistant Examiner* — Devin Barnett
(74) *Attorney, Agent, or Firm* — Jenkins, Wilson, Taylor & Hunt, P.A.

(57) ABSTRACT

Equipment cradles, rack-mounted equipment systems, and related methods can include rack-mounted equipment, a rack-mounted equipment cabinet for storing the rack-mounted equipment, and at least one equipment cradle installed in the rack-mounted equipment cabinet for supporting the rack-mounted equipment stored therein. The equipment cradle can include telescoping rails including a right rail and a left rail, the telescoping rails being configured to extend between front and rear rails of the equipment cabinet, at least one post disposed on each of front and rear endplates of the telescoping rails, the at least one post being configured to be received by holes disposed in each of the front and rear rails of the equipment cabinet, and at least one cross brace having a first end configured to mount to the left rail and a second end configured to mount to the right rail.

17 Claims, 7 Drawing Sheets

(56) References Cited

U.S. PATENT DOCUMENTS

| | | | | |
|---|---|---|---|---|
| 3,613,132 A | * | 10/1971 | Weinhart | A47C 23/062 5/238 |
| 3,657,748 A | * | 4/1972 | Weinhart | A47C 23/062 5/238 |
| 4,745,644 A | * | 5/1988 | Pottschmidt | A47C 19/005 403/254 |
| 4,905,836 A | * | 3/1990 | Lindgren | F42B 12/70 206/557 |
| 5,022,541 A | * | 6/1991 | White | A47F 5/103 108/108 |
| 5,044,704 A | * | 9/1991 | Bussan | F25D 25/025 312/402 |
| 5,211,459 A | * | 5/1993 | Wu | G06F 1/184 211/26 |
| 5,626,406 A | * | 5/1997 | Schmid | A47B 88/08 211/26 |
| D393,512 S | * | 4/1998 | Van de Oudeweetering | D34/21 |
| 5,833,337 A | * | 11/1998 | Kofstad | H05K 7/1489 211/175 |
| 6,115,858 A | * | 9/2000 | Mitchell | A47C 19/024 5/200.1 |
| 6,416,145 B1 | * | 7/2002 | Singh | A47B 88/0422 312/333 |
| 6,550,874 B2 | * | 4/2003 | Walla | A47B 96/06 312/184 |
| 6,681,942 B2 | * | 1/2004 | Haney | A47B 88/044 211/183 |
| 6,702,412 B2 | * | 3/2004 | Dobler | A47B 88/0407 312/205 |
| 7,134,558 B1 | * | 11/2006 | Mimlitch, III | A47B 47/024 211/189 |
| 7,198,241 B1 | * | 4/2007 | Helgenberg | A47B 88/044 248/298.1 |
| 7,405,926 B2 | * | 7/2008 | Wu | H05K 7/1494 211/26 |
| 7,823,994 B2 | * | 11/2010 | Yang | H05K 7/1489 312/333 |
| 7,889,492 B2 | * | 2/2011 | Chen | G11B 33/08 211/26 |
| 7,988,245 B2 | * | 8/2011 | Machala | A47B 61/02 312/286 |
| 8,033,621 B2 | * | 10/2011 | Liang | H05K 7/1489 312/334.4 |
| D649,016 S | * | 11/2011 | Rasmussen | D8/354 |
| 8,132,874 B2 | * | 3/2012 | Ong | H05K 7/1489 211/26 |
| 8,152,249 B2 | * | 4/2012 | Becklin | H05K 7/1421 312/223.1 |
| 8,162,417 B2 | * | 4/2012 | Briggs | G06F 1/181 312/223.2 |
| 8,356,718 B2 | * | 1/2013 | Yang | H05K 7/1489 211/26 |
| 9,161,625 B2 | * | 10/2015 | Chen | A47B 88/044 |
| 9,229,492 B2 | * | 1/2016 | Henderson | G06F 1/181 |
| 2002/0084734 A1 | * | 7/2002 | Shih | A47B 88/044 312/334.4 |
| 2004/0093670 A1 | * | 5/2004 | Polevoy | A47C 19/02 5/200.1 |
| 2004/0145286 A1 | * | 7/2004 | Kim | A47B 88/0418 312/334.4 |
| 2005/0285492 A1 | * | 12/2005 | Hu | A47B 88/044 312/334.4 |
| 2005/0285493 A1 | * | 12/2005 | Hu | A47B 88/044 312/334.4 |
| 2007/0175836 A1 | * | 8/2007 | Bumeder | H04Q 1/064 211/26 |
| 2008/0036347 A1 | * | 2/2008 | Liang | A47B 88/04 312/334.5 |
| 2011/0235266 A1 | * | 9/2011 | Sun | G06F 1/187 361/679.33 |
| 2011/0253647 A1 | * | 10/2011 | Yu | H05K 7/1491 211/26 |
| 2012/0048815 A1 | * | 3/2012 | Ye | H05K 7/20172 211/26 |
| 2012/0055889 A1 | * | 3/2012 | Li | A47B 5/06 211/26 |
| 2012/0074077 A1 | * | 3/2012 | Chan | H01L 23/4006 211/26 |
| 2012/0080391 A1 | * | 4/2012 | Nakamura | G06F 1/181 211/26 |
| 2012/0161599 A1 | * | 6/2012 | Chen | H05K 7/1489 312/333 |
| 2012/0223030 A1 | * | 9/2012 | Lohman | H05K 9/0016 211/26 |
| 2013/0048581 A1 | * | 2/2013 | Kuo | H05K 7/1489 211/26 |
| 2013/0068706 A1 | * | 3/2013 | Chen | H05K 7/1489 211/26 |
| 2013/0112633 A1 | * | 5/2013 | Chen | G06F 1/187 211/26 |
| 2013/0126450 A1 | * | 5/2013 | Kuo | G02F 1/133308 211/26 |
| 2013/0128524 A1 | * | 5/2013 | Li | H05K 5/02 362/97.1 |
| 2013/0128540 A1 | * | 5/2013 | Kuo | H04N 5/64 362/97.1 |
| 2014/0016061 A1 | * | 1/2014 | Kuo | H05K 5/02 349/58 |
| 2014/0034585 A1 | * | 2/2014 | Wu | H05K 13/0069 211/26 |
| 2014/0036196 A1 | * | 2/2014 | Hsiao | H05K 7/20 349/58 |
| 2014/0159554 A1 | * | 6/2014 | Liu | H05K 7/1488 312/223.2 |
| 2015/0122752 A1 | * | 5/2015 | Shen | H05K 7/1488 211/26 |
| 2015/0164223 A1 | * | 6/2015 | Lawson | A47B 88/04 312/334.5 |
| 2016/0165761 A1 | * | 6/2016 | Cox | G06F 1/20 361/679.53 |

* cited by examiner

EQUIPMENT CRADLES, RACK-MOUNTED EQUIPMENT SYSTEMS, AND RELATED METHODS

TECHNICAL FIELD

The subject matter described herein relates generally to equipment cradles for supporting equipment stored in equipment cabinets. More specifically, the subject matter relates to equipment cradles, rack-mounted equipment systems, and related methods.

BACKGROUND

Currently, converged infrastructure (CI) network, storage, and computer systems are subject to both dynamic loads (i.e., during travel) and static loads (i.e., after configuration at the destination). While many existing equipment cabinets, containers, etc., have been developed to improve and allow the shipment of CI systems without major problems, often the CI systems need to be upgraded to expand or deploy new technologies that are supported by additional equipment. In some aspects, the equipment can be standard equipment (i.e., equipment weighing approximately 200 pounds or less), large equipment (i.e., equipment weighing approximately more than 600 pounds), or carrier packs of equipment, each of which requires support systems to carry the associated loads statically and dynamically.

Notably, there are no existing support systems that are flexibly configured to support standard equipment, large equipment, and/or carrier packs of equipment. In fact, most known systems are configured only to support standard equipment. Such known systems may be referred to as equipment cradles and may be installed into equipment cabinets, containers, etc., before installation of the standard equipment. Generally, these equipment cradles are telescoping and are expanded between equipment rails of the equipment cabinets and secured in the front and rear to these rails using fasteners. However, in order to install these equipment cradles, at least two (2) people are necessary. For example, at least one installer at a front of an equipment cabinet to secure a first end of a telescoping cradle rail to the equipment rails of the cabinet and at least one installer at a rear of the equipment cabinet to secure a second end of a telescoping cradle rail to the equipment rails of the equipment cabinet are needed. Yet, the necessity of at least two installers is inefficient and costly, as installation of equipment cradles by only one installer is desirable.

SUMMARY

Equipment cradles, rack-mounted equipment systems, and related methods are disclosed. According to one exemplary embodiment, rack-mounted equipment systems may comprise rack-mounted equipment (including equipment weighing 600 pounds or more), a rack-mounted equipment cabinet for storing the rack-mounted equipment, and at least one equipment cradle installed in the rack-mounted equipment cabinet for supporting the rack-mounted equipment stored therein. The equipment cradle may comprise telescoping rails including a right rail and a left rail, the telescoping rails being configured to extend between front and rear rails of the rack-mounted equipment cabinet, at least one post disposed on each of front and rear endplates of the telescoping rails, the at least one post being configured to be received by holes disposed in each of the front and rear rails of the rack-mounted equipment cabinet, and at least one cross brace having a first end and a second end, the first end configured to mount to the left rail and the second end configured to mount to the right rail.

BRIEF DESCRIPTION OF THE DRAWINGS

The subject matter described herein will now be explained with reference to the accompanying drawings of which.

DETAILED DESCRIPTION

The subject matter described herein discloses equipment cradles, rack-mounted equipment systems, and related methods for installing equipment cradles in rack-mounted equipment cabinets. In particular, the present subject matter discloses equipment cradles that are configured to be installed in rack-mounted equipment cabinets in order to dynamically or statically support large pieces of rack-mounted equipment, equipment modules, and/or carrier packs of equipment weighing approximately 600 or more pounds with minimal deflection. While the equipment cradles disclosed herein are capable of supporting large pieces of rack-mounted equipment, such equipment cradles are also capable of supporting rack-mounted equipment weighing less than 600 pounds, i.e., 200 pound loads or less. By comparison, most conventional equipment cradles are only capable of supporting equipment weighing less than 200 pounds and are in no way capable of supporting larger pieces of equipment in either dynamic shipping or static conditions.

In addition, the presently disclosed equipment cradle is configured to be installed in an equipment cabinet by a single person installer. Due to the structural configuration of the equipment cradle, as described below, a single installer may be able to securely position the equipment cradle within an equipment cabinet without having to fasten the cradle in place first. Such a design may be additionally advantageous as it is configured to be adjustable for different spacing between equipment rails of the equipment cabinet, although the equipment cradle may come preconfigured for installation in a standard 19" Electronic Industries Alliance (EIA) rack.

As used herein, "rack-mounted equipment" can comprise a "converged infrastructure system" or "CI system", such as VBLOCK® Systems by VCE Company, LLC. In some aspects, a CI system can comprise multiple components or elements associated with a preconfigured or prepackaged computing platform. For example, a CI system can comprise a computing platform or unit associated with racks of physical components and related software for performing virtualization and/or other functions. In some aspects, a CI system can comprise multiple components that include one or more computing components, software components, networking components, storage components, hardware components, and/or firmware components that can be stored in a rack-mounted equipment cabinet (e.g., a standardized customer 19" EIA rack or an existing CI system cabinet). For example, an exemplary CI system can comprise equipment modules, data storage devices, servers, networking equipment, and software for managing physical resources and/or virtualized resources (e.g., virtual servers).

As used herein, "equipment module" can comprise a "server", "server element", "server module", or any "compute component" that is a server component, a CI component, or any like physical or hardware component.

Reference will now be made in detail to exemplary embodiments of the subject matter described herein, examples of which are illustrated in the accompanying drawings. Wherever possible, the same reference numbers will be used throughout the drawings to refer to the same or like parts.

Figure 1A:
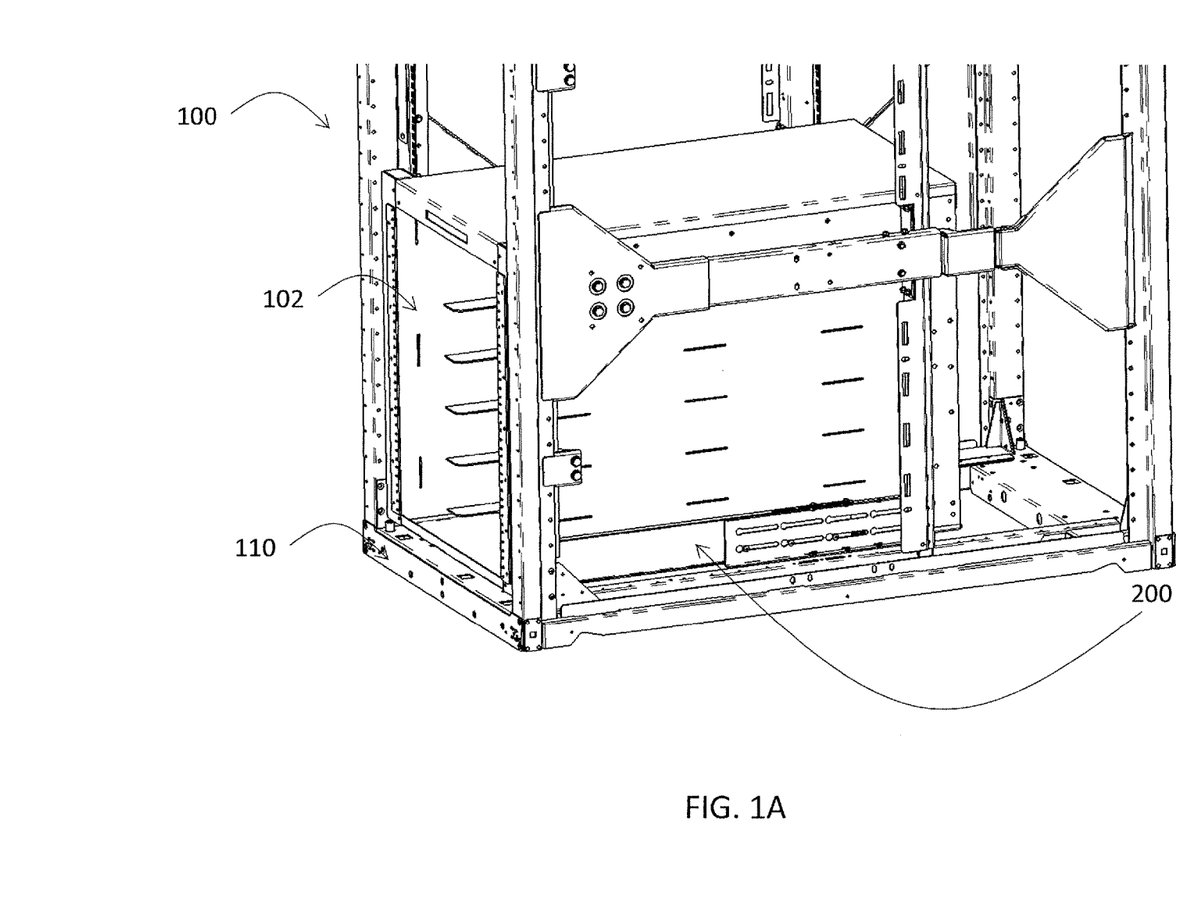
FIG. 1A is a front perspective view illustrating a rack-mounted equipment system comprising an equipment cabinet with an exemplary equipment cradle installed therein and supporting a large piece of rack-mounted equipment according to an embodiment of the subject matter described herein.
Figure 1B:
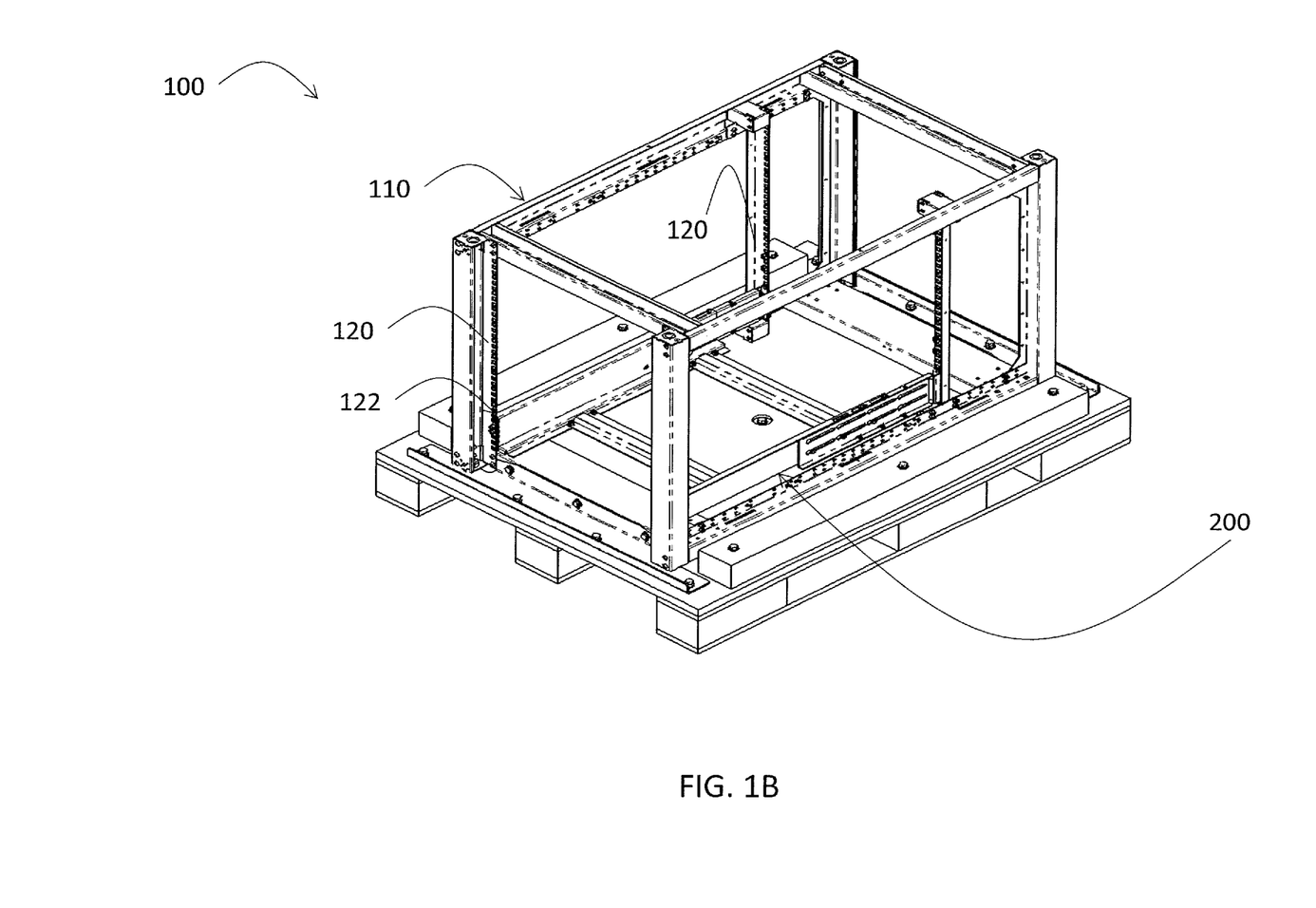
FIG. 1B is a front perspective view illustrating a rack-mounted equipment system comprising an equipment cabinet with an exemplary equipment cradle installed therein according to an embodiment of the subject matter described herein.

FIGS. 1A-1B are each perspective views illustrating an exemplary rack-mounted equipment system, generally designated 100, according to an embodiment of the subject matter described herein. As illustrated in FIG. 1A, rack-mounted equipment system 100 may comprise an equipment cabinet, generally designated 110, configured to support rack-mounted equipment generally designated 102, including at least one equipment module or a carrier pack of equipment, and an equipment cradle generally designated 200 installed therein. Notably, the rack-mounted equipment 102 may include large or heavy equipment, including equipment weighing 600 or more pounds. For example, and as illustrated in FIG. 1A, rack-mounted equipment 102 may comprise an equipment carrier pack for receiving equipment modules. In this manner, equipment cabinet 110 may be configured to securely store large equipment so that the equipment is sufficiently supported and only minimally deflects (i.e., sags). In some aspects, regardless of the weight of the equipment, rack-mounted equipment 102 may be mounted to equipment cabinet 110 by way of securing the equipment in a conventional manner. For example, the equipment may be secured to equipment cabinet 110 by mounting the equipment to cabinet 110 via brackets, supports, shelves, etc., mounted to rails (e.g., 120, FIG. 1B) of the cabinet. In another example, the equipment may be secured directly to cabinet 110 via fastening mechanisms.

Referring now to FIG. 1B, rack-mounted equipment system 100 is illustrated without equipment 102 in order to provide a more detailed view of equipment cabinet 110 having an installed equipment cradle (e.g., 200) therein. In some aspects, equipment cabinet 110 may include equipment rails 120. Rails 120 may be provided at each of the four corners of the equipment cabinet, where cabinet 110 is configured as square, rectangle, etc. In other aspects, rails 120 may be provided in intermediate locations, such as in between front and rear rails 120. For example, as illustrated in FIG. 1, six rails 120 are provided—one in each corner and one in between each of the right front and rear rails 120 and the left front and rear rails 120. As used herein, "right" and "left" refer to the sides of the cabinet from a front perspective view, for example as illustrated in FIG. 1B.

In some aspects, equipment cabinet 110 may be configured as a standardized equipment cabinet or enclosure for mounting multiple equipment modules, such as, for example a 19" EIA rack, a 23" EIA rack, an Open Rack, etc., configured to support equipment modules of 537 mm, etc. Where equipment cabinet 110 is configured as a standardized equipment rack, such as, for e.g., a standard EIA 19" rack, one or more rails 120 may comprise a plurality of holes generally designated 122. For example, plurality of holes 122 may be disposed in an even distribution along an axial length of each of rails 120. In some aspects, plurality of holes 122 may be configured as standard cage nut holes for receiving cage nuts or the equivalent. In such a manner, plurality of holes 122 may be suitably disposed, such as approximately 0.625 inches apart from center to center along an axial length of rails 120. Alternatively, plurality of holes 122 may comprise any diameter, shape, distribution, etc., along rails 120.

Equipment cradle 200 may be installed in equipment cabinet 110. In some aspects, equipment cabinet 110 may be a pre-configured or constructed enclosure dynamically shipped with large pieces of rack-mounted equipment 102 being supported by equipment cradle 200. Alternatively, cabinet 110 may be shipped to a customer without any equipment installed, in which case, an installer may install equipment cradle 200 to cabinet 110 and then secure large pieces of rack-mounted equipment therein. Regardless, equipment cradle 200 may be configured to be readily installed in an equipment cabinet comprising standardized rack architecture upon receipt by a consumer end-user.

Figure 2:
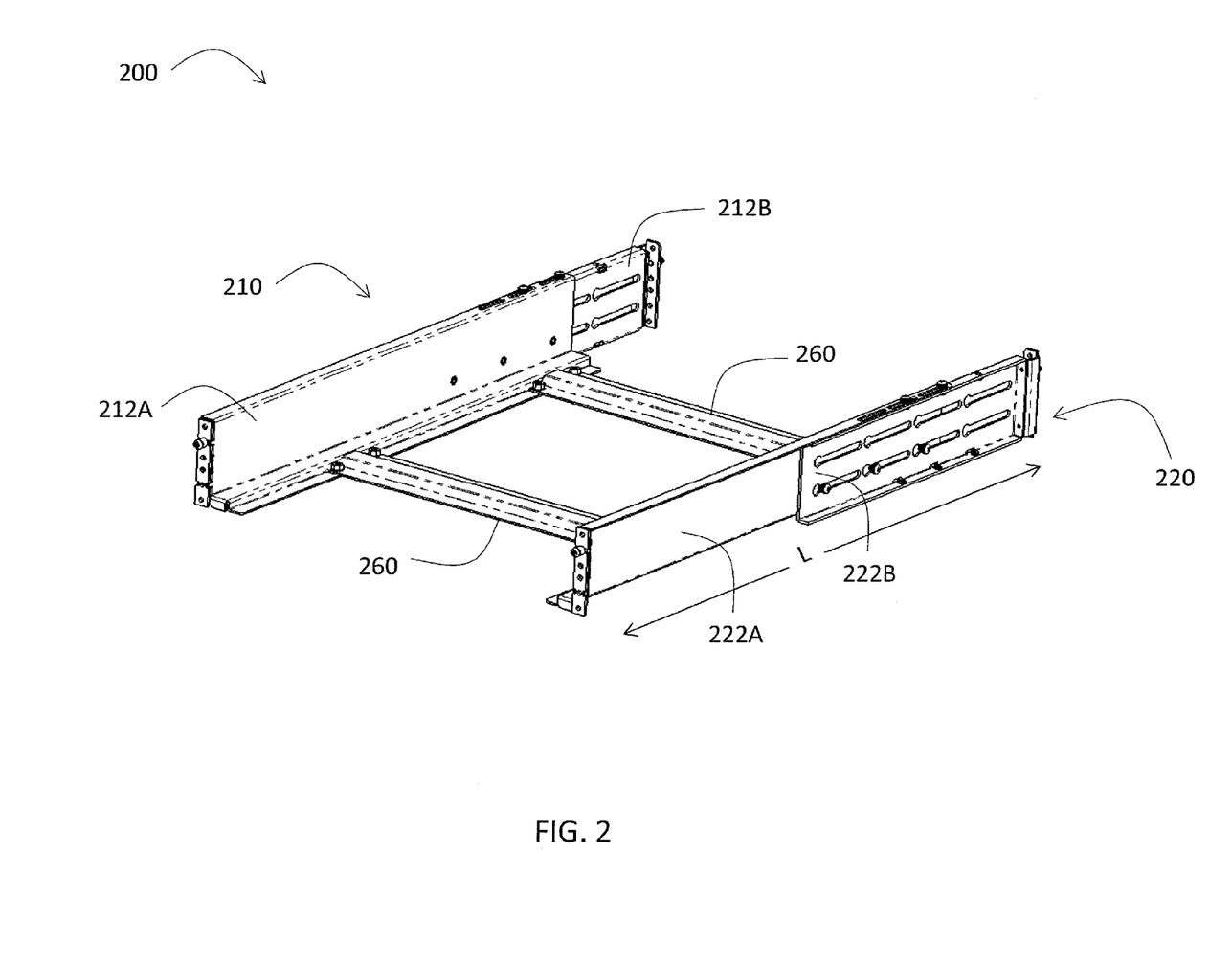
FIG. 2 is a front perspective view illustrating an exemplary equipment cradle according to an embodiment of the subject matter described herein.
Figure 3A:
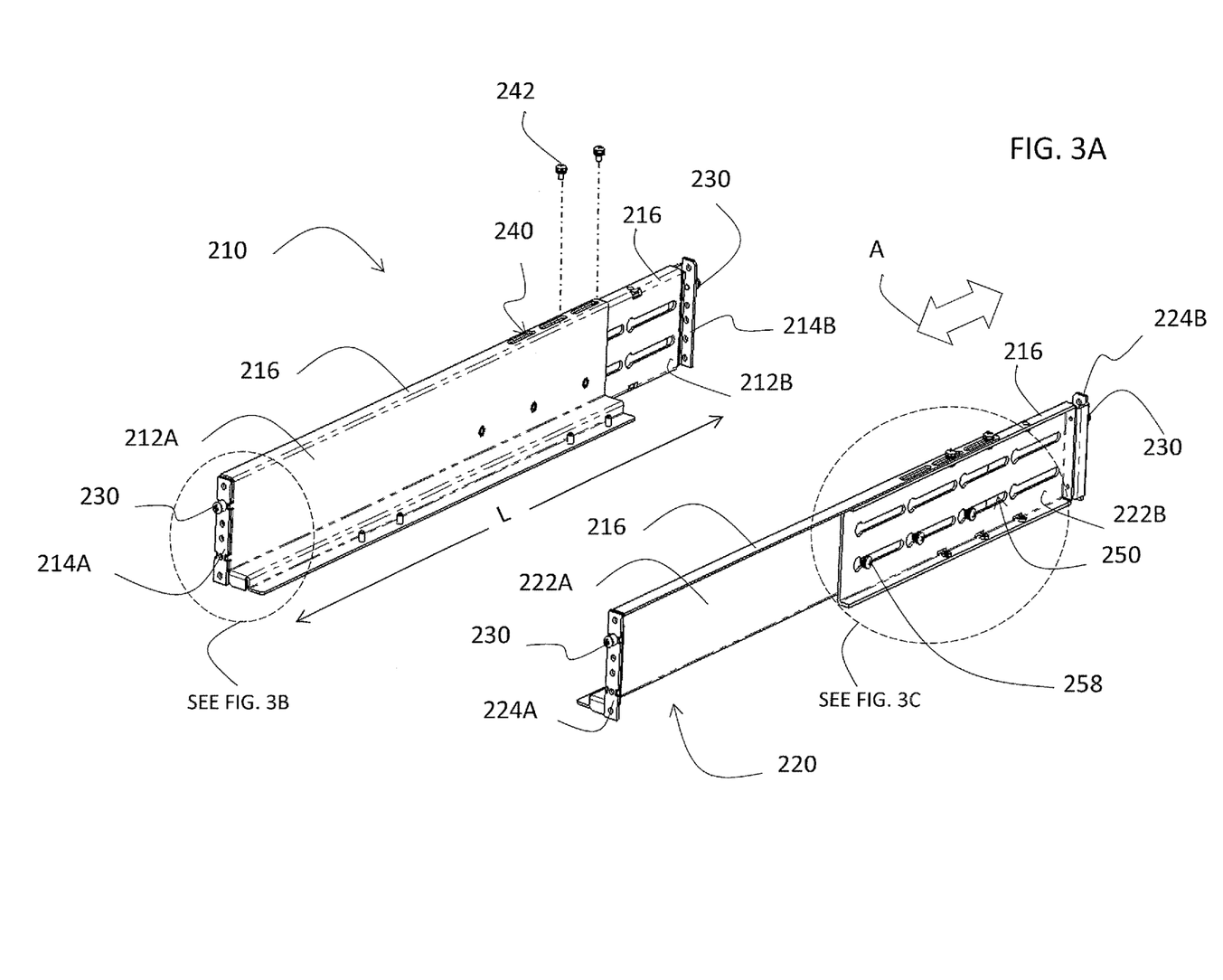
FIG. 3A is a front perspective view illustrating right and left rails of an exemplary equipment cradle according to an embodiment of the subject matter described herein.
Figure 3B:
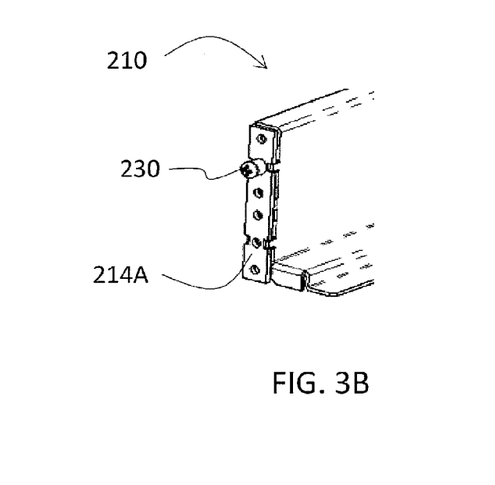
FIG. 3B is a front perspective view illustrating a detailed view of a front endplate of the left rail of FIG. 3A.
Figure 3C:
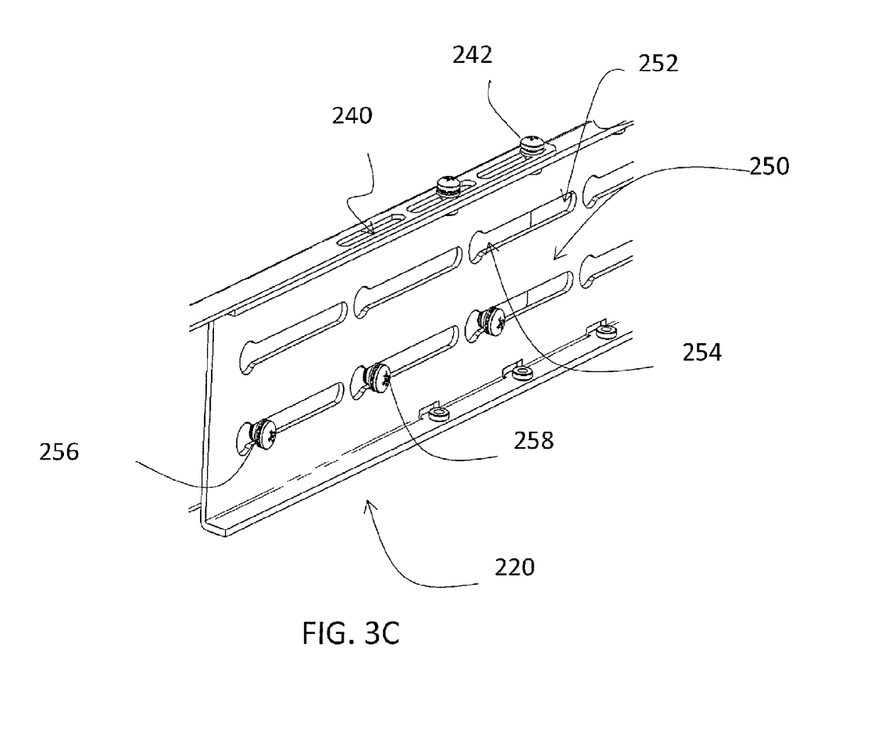
FIG. 3C is a front perspective view illustrating a detailed view of a first rail half and a second rail half of the right rail of FIG. 3A.
Figure 4:
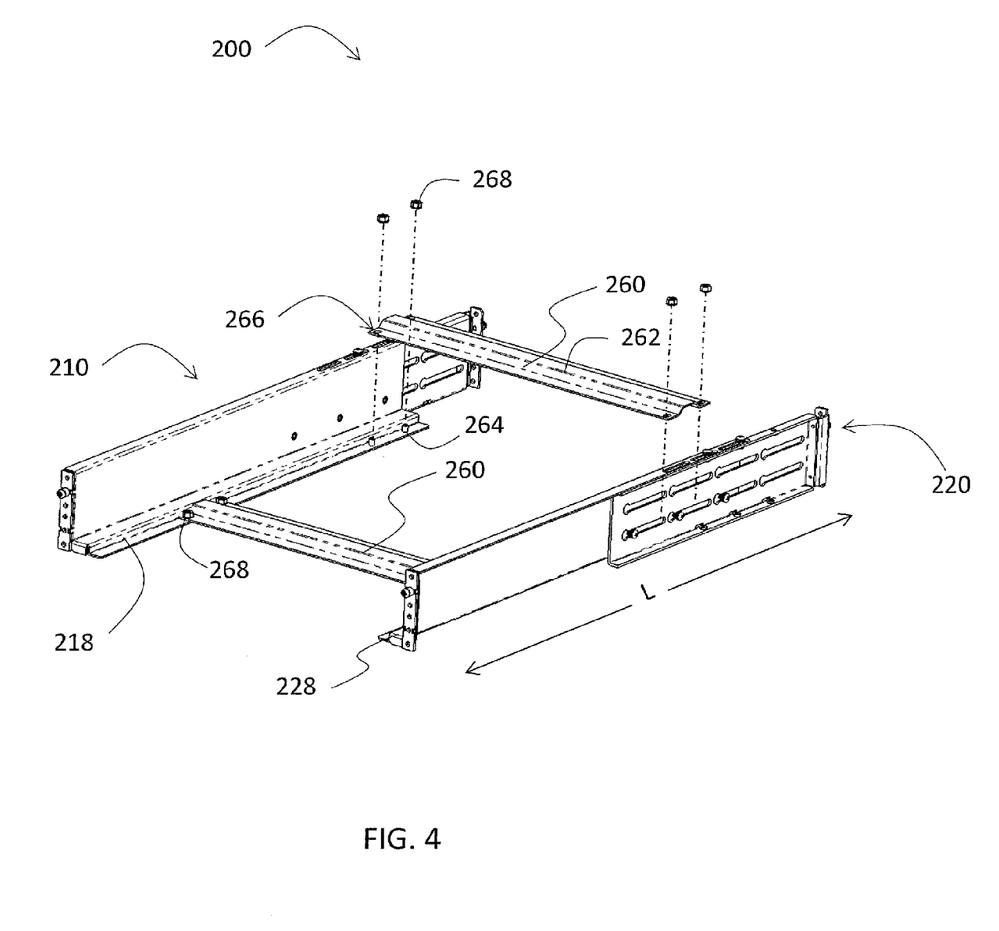
FIG. 4 is a front perspective view illustrating a cross brace being installed into an exemplary equipment cradle according to an embodiment of the subject matter described herein.

Referring now to FIGS. 2-4, equipment cradle 200 will be described in further detail. FIG. 2 illustrates a front perspective view of a fully configured equipment cradle 200, FIGS. 3A-3C each illustrate various portions of the equipment cradle 200 in more detail, and FIG. 4 illustrates at least one cross brace being attached to equipment cradle 200. In some aspects, equipment cradle 200 can comprise a material configured to withstand static and dynamic load requirements. Static and/or dynamic load requirements may vary depending on the weight of the rack-mounted equipment. For example, for large pieces of rack-mounted equipment, equipment cradle 200 may be configured to withstand static and/or dynamic loads of approximately 600 or more pounds. In some aspects, a material of equipment cradle 200 can comprise a metal or metallic material (e.g., aluminum (Al), steel, iron (Fe), alloys thereof, etc.), any non-metallic material (e.g., plastic, polymeric, etc.), and/or any combinations thereof.

According to FIG. 2, equipment cradle 200 may comprise telescoping rails including a left telescoping rail generally designated 210 and a right telescoping rail generally designated 220. Telescoping rails 210, 220 may be configured to extend between or span front and rear rails 120 (shown and described with respect to FIG. 1B) of equipment cabinet 110. In some aspects, telescoping rails 210, 220 may each comprise two components adjustable relative to one another. For example, left telescoping rail 210 may comprise a first rail half 212A and a second rail half 212B, while right telescoping rail 220 may comprise a first rail half 222A and a second rail half 222B. The second rail halves 212B, 222B may be configured to adjustably slide within first rail halves 212A, 222A, respectively. In such a manner a telescoping length L of each of telescoping rails 210, 220 may be adjusted between front and rear rails 120 of equipment cabinet 110. In some aspects, each of telescoping rails 210, 220 may be provided to a consumer at a preconfigured telescoping length L, i.e., a telescoping length sufficiently sized to extend between front and rear rails of a standardized 19" EIA rack.

Now referring to FIG. 3A, each of telescoping rails 210, 220 may be configured with front and rear endplates disposed on opposing ends of each of telescoping rails 210, 220. For example, a front endplate 214A and a rear endplate 214B may be disposed at a front and rear, respectively, of left telescoping rail 210, while a front endplate 224A and a rear endplate 224B may be disposed at a front and rear, respectively, of right telescoping rail 220. In some aspects, each of endplates 214A-B, 224A-B may be configured with at least one post. For example, FIG. 3A illustrates endplates 214A, 214B, 224A, 224B each comprising at least one post, generally designated 230, extending away from each of the endplates. In some aspects, the post, such as post 230, may be configured to be received by one of plurality of holes 122 (shown in FIG. 1B) disposed in front and rear rails 120 of cabinet 110. For example, and as illustrated in greater detail in FIG. 3B, a detailed front perspective view of endplate 214A of left rail 210 is provided with at least one post 230 extending away from endplate 214A. Notably, however, the following description of post 230 relative to endplate 214A is applicable to each post 230 disposed on each of the other endplates (i.e., 214B, 224A, 224B). In some aspects, post 230 may include a removable standoff with a similarly sized fastener extending therethrough in order to secure the standoff to endplate 214A via a nut and a lock washer, or similar. In other aspects, post 230 may comprise an integral unit that is manufactured with endplate 214A or that is otherwise fixedly mounted to endplate 214A. Regardless, post 230 may be sized to be received within standardized holes (e.g., 122, FIG. 1B) in rails (e.g., 120, FIG. 1B) of a standardized equipment cabinet configuration.

In this manner, a single person installer is able to position equipment cradle 200 into equipment cabinet 110 by individually fitting one post 230 at a time into equipment rails 120. For example, and referring back to FIG. 3A, a single installer can position left telescoping rail 210 and insert post 230 on front endplate 214A into one of plurality of holes 122 on a left front rail 120 and then insert post 230 on rear endplate 214B into one of plurality of holes 122 at a corresponding height on a left rear rail 120. Similarly in this example, the installer can position right telescoping rail 220 and insert post 230 on front endplate 224A into one of plurality of holes 122 on a right front rail 120 and insert post 230 on rear endplate 224B into one of plurality of holes 122 at a corresponding height on a right rear rail 120. It may be noted that the installer may decide which one of plurality of holes 122 to insert posts 230 into depending on a height of equipment 102 being installed and support in cabinet 110.

In some aspects, however, telescoping rails 210, 220 may require adjustment in order to expand to a telescoping length L sufficient to extend between front and rear rails 120 of cabinet 110. In reference to FIGS. 1A-1B, for example, standardized cabinet 110 is modified to include intermediate rails 120 between front and rear rails 120 in order to accommodate equipment 102 having a length smaller than a length of cabinet 110. As such, equipment 102 may be secured to cabinet 110 at intermediate and front rails 120, so that telescoping rails 210, 220 are to be secured to cabinet 110 at a likewise location. Since such a length between rails 120 (e.g., a front to intermediate rail length) is not a standardized length, a telescoping length L of telescoping rails 210, 220 may have to be adjusted so that the telescoping length L is sufficient to extend between front and the new rear (i.e., intermediate) rails 120 of cabinet 110.

In order to adjust the telescoping length L of telescoping rails 210, 220, each of telescoping rails 210, 220 may comprise a longitudinally extending flange on a top surface of each of the rails. For example, and as illustrated in FIG. 3A, flanges 216 may extend an entire axial length of each rail half 212A, 212B, 222A, 222B and extend outwardly from an interior face of each rail 210, 220. In this example, flanges 216 disposed on left rail halves 212A-B extend toward the left, while flanges 216 disposed on right rail halves 222A-B extend toward the right. In some aspects, flanges 216 of each rail half 212A, 212B, 222A, 222B may each comprise one or more elongated slots generally designated 240 that are configured to receive locking fasteners generally designed 242, each of which are provided in greater detail in FIG. 3C. Thus, a width of each elongated slot 240 must be wide enough to receive a portion of fastener 242, but small enough so that fastener 242 may be retained within each slot 240.

In some aspects, one or more elongated slots 240 may be disposed over a substantial length of longitudinally extending flange 216 or over a portion of flange 216. For example, FIG. 3A illustrates three slots disposed over both halves of each telescoping rail 210, 220, where in first rail halves 212A, 222A the slots 240 are disposed towards a rear portion of flange 216, and in second rail halves 212B, 222B the slots 240 are disposed towards a front and central portion of flange 216. In this manner, second rail halves 212B, 222B may be slid within first rail halves 212A, 222A so that flanges 216 of first rail halves 212A, 222A rest on top of flanges 216 of second rail halves 212B, 222B and slots 240 on each set of rail halves may be aligned to receive fasteners 242 therethrough. Alternatively, one long slot or fewer or more slots 240 may be disposed along flanges 216.

Referring now to FIG. 3C, where a portion of right rail 220 is illustrated in a front perspective view in greater detail, when slots 240 are aligned and fastener 242 is inserted therethrough, a disposition of the first rail half 212A, 222A (see, e.g., FIG. 3A) of each telescoping rail 210, 220 may be maintained relative to the second rail half 212B, 222B (see, e.g., FIG. 3A), respectively, to thereby maintain telescoping length L of each telescoping rail 210, 220. For example, in FIG. 3C, where fastener 242 is a shoulder rivet, shoulder screw, eyelet, bolt, etc., fastener 242 may be secured through slots 240 on each half of telescoping rail 210, 220 and tightened in order to maintain a disposition of the first rail half 212A, 222A of each telescoping rail 210, 220 relative to the second rail half 212B, 222B, respectively.

As noted above, and in reference to FIG. 3A, equipment cradle 200 may be provided to a consumer end-user with a pre-configured telescoping length L that may be roughly adjustable by removing fasteners 242 and repositioning alignment of one or more elongated slots 240 on each of flanges 216 of first rail half 212A, 222A and second rail half 212B, 222B. In this manner, second rail half 212B, 222B may be slid away from or closer to a rear of first rail half 212A, 222A, respectively, until slots 240 are realigned and a desired telescoping length L may be achieved via fine adjustments of rail half 212B, 222B relative to first rail half 212A, 222A, respectively. Arrow A illustrates a direction along which second rail half 212B, 222B may be slid relative to first rail half 212A, 222A, respectively. For example, in order to dramatically shorten a telescoping length L of rails 210, 212, fastener 242 may be removed and second rail half 212B, 222B may be slid in towards a rear of first rail half 212A, 222A, respectively, until the new alignment of slots 240 is reached. By contrast, for example, in order to dramatically lengthen a telescoping length L of rails 210, 212, fastener 242 may be removed and second rail half 212B, 222B may be slid away from a rear of first rail half 212A, 222A, respectively, until the new alignment of slots 240 is reached. To maintain the adjusted telescoping length of rails 210, 212, fastener 242 may be replaced within aligned slots 240. Finer adjustments may be made by simply loosening fasteners 242 within slots 240 and sliding second rail half 212B, 222B away from or closer to a rear of first rail half 212A, 222A, respectively. For example, in order to slightly shorten telescoping length L, fasteners 242 may be loosened and second rail half 212B, 222B may be slid closer to a rear of first rail half 212A, 222A, respectively, until the desired length is reached. By contrast, in order to slightly lengthen telescoping length L, fasteners 242 may be loosened and second rail half 212B, 222B may be slid away from a rear of first rail half 212A, 222A until the desired length is reached. Notably, each telescoping rail 210, 220 may have its telescoping length L adjusted individually so that only a single installer is necessary.

Referring back to FIG. 3A, telescoping rails 210, 220 may additionally comprise a plurality of keyhole slots 250 used to aid in sliding rail halves relative to one another. For example, second rail halves 212B, 222B may each comprise plurality of keyhole slots generally designated 250 disposed over a substantial portion of each longitudinally extending surface. As illustrated in FIG. 3A, there can, for example, be eight keyhole slots disposed on second rail halves 212B, 222B, where the keyhole slots 250 are arranged as two rows of four slots. More or less keyhole slots 250 may be disposed on second rail halves 212B, 222B. For example, there may be two rows of one elongated keyhole slot per row.

Referring now to FIG. 3C, each keyhole slot 250 may comprise an elongated portion generally designated 252 and a portion generally designated 254 comprising a diameter larger than a width of elongated portion 252. Portion 254 may be configured to receive one or more standoffs 256 and comprising a locking fastener 258 or other fastening mechanism therein. For example, portion 254 may be formed as a circular portion with a diameter large enough to receive a standard locking fastener. One or more standoffs 256 may be disposed on first rail halves 212A, 222A. For example, there may be three standoffs 256 spaced apart on first rail halves 212A, 222A. Each standoff 256 may be configured to receive one locking fastener 258. In some aspects, locking fastener 258 may comprise a shoulder rivet, shoulder screw, eyelet, bolt, etc., and may be secured through slots 250 on each half of telescoping rail 210, 220 and tightened in standoffs 256 order to maintain a disposition of the first rail half 212A, 222A of each telescoping rail 210, 220, respectively, relative to the second rail half 212B, 222B. In some aspects, locking fasteners 258 may be a same type of fastener or different than locking fastener 242. As illustrated in FIG. 3C, for example, fasteners 242 and 258 each comprise screws.

When each of fasteners 258 are threaded into respective standoffs 256, a gap is formed between a bottom surface of a head of fastener 258 and a surface of first rail halves 212A, 222A that is equivalent to a length of a standoff 256. Accordingly, a longer in length standoff will result in a larger gap. In this manner, when one or more standoffs 256 and/or fasteners 258 are moved into alignment with portion 254 of keyhole slots 250, portion 254 may be sized and/or shaped to receive standoffs 256 and/or fasteners 258 therein. Once received within portion 254, standoffs 256 and/or fasteners 258 may be configured to slide within elongated portion 252. Tightening fasteners 258 within standoffs 256 may result in maintaining a disposition of second rail half 212B, 222B relative to first rail half 212A, 222A.

Notably, in order to provide for rough adjustments of telescoping length L of rails 210, 220, fasteners 258 may be loosened from standoffs 256 and standoffs 256 and/or fasteners 258 may be slid along elongated portion 252 until portion 254 is reached so that fasteners 258 may be removed from standoffs 256 and thereby removed from slots 250. Once removed, standoffs 256 may be repositioned at a different set of slots 250. For example, in order to dramatically shorten a telescoping length of rails 210, 220, fasteners 258 may be removed and standoffs 256 may be repositioned into the respective front most keyhole slots 250. By contrast, in order to dramatically length a telescoping length of rails 210, 220, fasteners 258 may be removed and standoffs 256 may be repositioned into the respective rear most keyhole slots 250. In this manner, a more rough adjustment of telescoping length L of rails 210, 220 may be made. Finer adjustments may be made by simply loosening fasteners 258 within standoffs 256 and sliding second rail half 212B, 222B along elongated portion 252 away from or closer to a rear of first rail half 212A, 222A. Arrow A illustrates a direction in which second rail half 212B, 222B may be slid relative to first rail half 212A, 222A. For example, in order to slightly shorten telescoping length L, fasteners 258 may be loosened and second rail half 212B, 222B may be slid closer to a rear of first rail half 212A, 222A, respectively, until the desired length is reached. By contrast, in order to slightly lengthen telescoping length L, fasteners 258 may be loosened and second rail half 212B, 222B may be slid away from a rear of first rail half 212A, 222A, respectively, until the desired length is reached.

Where rails include elongated slots 240 and locking fasteners 242 and keyhole slots 250 and standoffs 256 with locking fasteners 258, it is noted that fine and/or rough adjustments must be made to each simultaneously. For example, to make rough adjustments to telescoping length L, locking fasteners 242 and 258 must all be removed and then reinserted. Likewise, for example, to make fine adjustments to telescoping length L locking fasteners 242 and 258 must all be loosened.

Referring now to FIG. 4, equipment cradle 200 is illustrated in perspective view having a telescoping length L established and maintained by locking fasteners (see, 242, 258, FIG. 3A). In some aspects, equipment cradle 200 may comprise at least one cross brace generally designated 260 for tying telescoping rails 210, 220 together and/or distributing a load (e.g., equipment 102) evenly throughout cradle 200. For example, and as illustrated in FIG. 4, there may be two cross braces 260. However, there may be more than two cross braces 260 depending on a length and/or width of equipment cradle 200. Notably, a consumer end-user may be able to decide how many cross braces 260 to use in equipment cradle 200 and may be able to add more cross braces 260 depending on a load to be supported by the equipment cradle. As a result, at least one cross brace 260 may comprise or consist of a material sufficient to enable load distribution through equipment cradle 200. For example, at least one cross braces 260 may comprise or consist of a metal or metallic material (e.g., aluminum (Al), steel, iron (Fe), alloys thereof, etc.), any non-metallic material (e.g., plastic, polymeric, etc.), and/or any combinations thereof.

At least one cross brace 260 may comprise a longitudinally extending body 262 having a first end and a second end. A width of longitudinally extending body 262 may vary depending on a width of equipment cradle 200, which may depend on a width of cabinet 110. In one aspect, each end of cross brace 260 may be mounted onto pin struts disposed on an interior surface of each telescoping rail 210, 220. For example, left pin strut 218 may be disposed on a first rail half 212A of left rail 210 and right pin strut 228 may be disposed on a first rail half 222A of right rail 220. Pin struts 218, 228 may extend from a body of first rail half 212A, 222A towards an interior of equipment cradle 200 and may be sized such that one or more studs 264 may be disposed thereon.

Studs 264 may be utilized to be inserted through one or more orifices 266 in at least one cross brace 260. For example, each end of at least one cross brace 260 may comprise two orifices 266, spaced a predetermined distance apart. Orifices 266 may comprise an opening slightly larger than a diameter of studs 264. Where orifices 266 are shaped as squares, rectangles, and/or any other shape, studs 264 may be correspondingly sized and shaped to receive orifices 266. For example, where each end of at least one cross brace 260 comprises two orifices 266, each of pin struts 218, 228 may include four studs 264 grouped into two sets of two studs. As illustrated in FIG. 4, each set of two studs 264 may be spaced a distance apart corresponding to a distance apart of orifices 266 disposed on each end of cross brace 260. Therefore, orifices 266 disposed on each end of at least one cross brace 260 may be aligned with corresponding studs 264 disposed on each of pin struts 218, 228 in order to span a width of equipment cradle 200. In some aspects, disposition of studs 264 on pin struts 218, 228 may be preconfigured during manufacture, otherwise a consumer end-user may be able to optimally position studs 264 on pin struts 218, 228 during assembly of equipment cradle 200.

One or more fasteners 268 may be utilized to secure at least one cross brace 260 at each respective end to telescoping rails 210, 220. For example, fasteners 268 may be fastened onto studs 264 after orifices 266 have been inserted thereon. Fasteners 268 may comprise hexagon nuts including a lock washer. Other types of fasteners 268 that are sufficient to secure at least one cross brace 260 at each respective end to telescoping rails 210, 220 may also be utilized. In this manner, removal of at least one cross brace 260 is made easier as it simply requires loosening and/or removing fasteners 268.

Mounting at least one cross brace 260 onto each of telescoping rails 210, 220 may comprise positioning orifices 266 of a first end of longitudinally extending body 262 on studs 264 disposed on pin strut 218 of first rail half 212A and subsequently positioning orifices 266 of a second end of longitudinally extending body 262 on studs 264 disposed on pin strut 228 of first rail half 222A. Fasteners 268 may then be fastened onto studs 264 in order to secure at least one cross brace 260 to each telescoping rail. Mounting of additional cross braces 260 may be completed in a similar manner.

Figure 5:
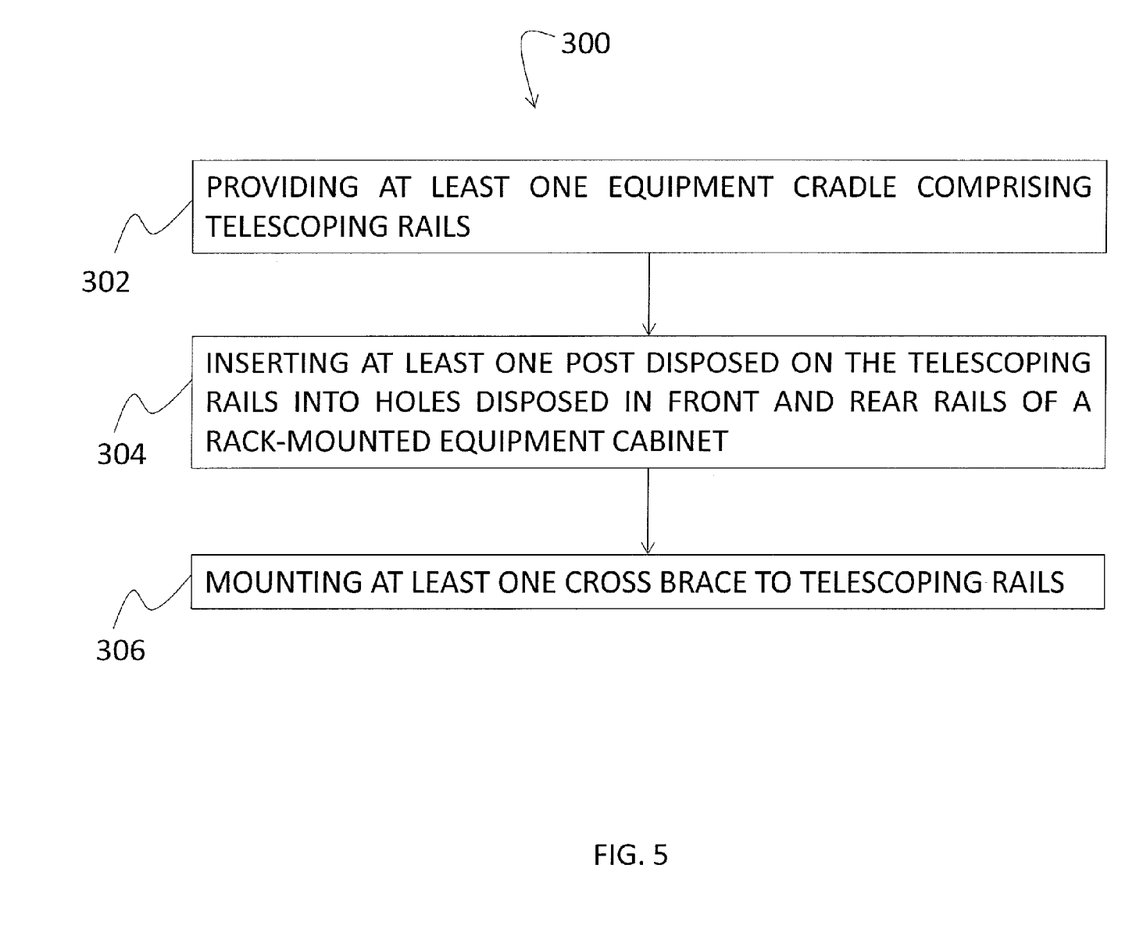
FIG. 5 is a flow diagram illustrating an exemplary method for installing an exemplary equipment cradle in a rack-mounted equipment cabinet according to an embodiment of the subject matter described herein.

Referring to FIG. 5, exemplary steps of a method, generally designated 300, for installing at least one equipment cradle in a rack-mounted equipment cabinet are disclosed. In some aspects, method 300 may be utilized for installing an equipment cradle 200 into a rack-mounted equipment cabinet 110, as described above in reference to FIGS. 1A-4.

In block 302, at least one equipment cradle 200 may be provided, where at least one equipment cradle 200 may comprise telescoping rails including a right rail 220 and a left rail 210.

In block 304, at least one post 230 disposed on each of front and rear endplates 214A-B, 224A-B of the telescoping rails 210, 220, respectively, may be inserted into holes 122 disposed in each of front and rear rails 120 of rack-mounted equipment cabinet 110, such that telescoping rails 210, 220 extend between front and rear rails 120 of rack-mounted equipment cabinet 110.

In block 306, a first end of at least one cross brace 260 may be mounted to left rail 210 and a second end of at least one cross brace 260 to right rail 220.

In some aspects, method 300 may further comprise supporting, by the equipment cradle 200, rack-mounted equipment 102 weighing approximately 600 pounds or more stored in rack-mounted equipment cabinet 110. By contrast, typical equipment cabinets are only configured to store equipment that weighs approximately 200 pounds or less.

In some aspects, method 300 may further comprise adjusting a telescoping length L of each telescoping rail 210, 220 between front and rear rails 120 of the rack-mounted equipment cabinet by sliding a second rail half 212B, 222B of each telescoping rail relative to a first rail half 212A, 222A.

In some aspects, method 300 may further comprise receiving, in one or more elongated slots 240 disposed on longitudinally extending flanges 216 of first rail half 212A, 222A and second rail half 212B, 222B of each telescoping rail, locking fasteners 242 that may be tightened within one or more elongated slots 240 in order to maintain a disposition of the first rail half 212A, 222A relative to the second rail half 212B, 222B, respectively, and thereby maintain telescoping length L of each telescoping rail 210, 220.

In some aspects, method 300 further comprises removing locking fasteners 242 and adjusting the disposition of the second rail half 212B, 222B relative to the first rail half 212A, 222A to achieve rough adjustments of telescoping length L of each telescoping rail, and loosening the locking fasteners 242 and slightly adjusting the disposition of the second rail half 212B, 222B relative to the first rail half 212A, 222A, respectively, to achieve fine adjustments of telescoping length L of each telescoping rail 210, 220. In some aspects, one or more standoffs 256 are disposed in first rail half 212A, 222A and a plurality of keyhole slots 250 are disposed in second rail half 212B, 222B, such that plurality of keyhole slots 250 are configured to receive one or more standoffs 256 in order to adjustably slide second rail half 212B, 222B relative to first rail half 212A, 222A.

Accordingly, it will be appreciated that exemplary process 300 is for illustrative purposes and that different and/or additional actions may be used. It will also be appreciated that various actions described herein may occur in a different order or sequence.

It will be understood that various details of the subject matter described herein may be changed without departing from the scope of the subject matter described herein. Furthermore, the foregoing description is for the purpose of illustration only, and not for the purpose of limitation, as the subject matter described herein is defined by the claims as set forth hereinafter

What is claimed is:

1. An equipment cradle for supporting electronic rack-mounted equipment stored in a rack-mounted equipment cabinet, the equipment cradle comprising:

telescoping rails including a right rail and a left rail, the telescoping rails being configured to extend between front and rear rails of the rack-mounted equipment cabinet;

at least one horizontal post disposed on each of front and rear endplates of the telescoping rails, the at least one horizontal post being configured to be received by holes disposed in each of the front and rear rails of the rack-mounted equipment cabinet; and at least one cross brace having a first end and a second end, the first end configured to mount to the left rail and the second end configured to mount to the right rail, wherein each of the telescoping rails comprises a lower flange extending from an interior surface of the corresponding telescoping rail, a in strut extending upwardly from the lower flange towards an interior of the equipment cradle, each pin strut comprising one or more studs disposed thereon; and wherein a respective one of the first end or the second end of the at least one cross brace is configured to be secured to the one or more studs by one or more fasteners;

wherein the at least one cross brace is configured to support and distribute a load placed thereon between the telescoping rails.

2. The equipment cradle of claim 1, wherein the telescoping rails each comprise a first rail half and a second rail half configured to adjustably slide within the first rail half, such that a telescoping length of each of the telescoping rails is adjustable between the front and rear rails of the rack-mounted equipment cabinet.

3. The equipment cradle of claim 2, further comprising one or more elongated slots disposed on longitudinally extending flanges of the first rail half and the second rail half of each of the telescoping rails, the one or more elongated slots being configured to receive locking fasteners that are tightenable within the one or more elongated slots in order to maintain a disposition of the first rail half relative to the second rail half and thereby maintain the telescoping length of each of the telescoping rails.

4. The equipment cradle of claim 3, wherein rough adjustments of the telescoping length of each of the telescoping rails is achievable by removing the locking fasteners and adjusting the disposition of the second rail half relative to the first rail half, and wherein fine adjustments of the telescoping length of each of the telescoping rails may be achieved by loosening the locking fasteners and slightly adjusting the disposition of the second rail half relative to the first rail half.

5. The equipment cradle of claim 2, wherein the first rail half comprises one or more standoffs and the second rail half comprises a plurality of keyhole slots configured to receive the one or more standoffs in order to adjustably slide the second rail half relative to the first rail half.

6. The equipment cradle of claim 5, wherein the plurality of keyhole slots comprise an elongated portion and a portion comprising a diameter larger than a width of the elongated portion that is configured to receive the one or more standoffs.

7. A rack-mounted equipment system comprising:
electronic rack-mounted equipment;
a rack-mounted equipment cabinet for storing the electronic rack-mounted equipment;
and at least one equipment cradle installed in the rack-mounted equipment cabinet for supporting the electronic rack-mounted equipment stored in the rack-mounted equipment cabinet, the at least one equipment cradle comprising:

telescoping rails including a right rail and a left rail, the telescoping rails being configured to extend between front and rear rails of the rack-mounted equipment cabinet, at least one horizontal post disposed on each of front and rear endplates of the telescoping rails, the at least one horizontal post being configured to be received by holes disposed in each of the front and rear rails of the rack-mounted equipment cabinet, and at least one cross brace having a first end and a second end, the first end configured to mount to the left rail and the second end configured to mount to the right rail;

wherein each of the telescoping rails comprises a lower flange extending from an interior surface thereof, a in strut extending upwardly from each lower flange towards an interior of the equipment cradle, each in strut comprising one or more studs disposed thereon;

wherein a respective one of the first end or the second end of the at least one cross brace is configured to be secured to the one or more studs by one or more fasteners; and wherein the at least one cross brace is configured to support and distribute a load placed thereon between the telescoping rails.

8. The rack-mounted equipment system of claim 7, wherein the telescoping rails each comprise a first rail half and a second rail half configured to adjustably slide within the first rail half, such that a telescoping length of each of the telescoping rails is adjustable between the front and rear rails of the rack-mounted equipment cabinet.

9. The rack-mounted equipment system of claim 8, further comprising one or more elongated slots disposed on longitudinally extending flanges of the first rail half and the second rail half of each of the telescoping rails, the one or more elongated slots being configured to receive locking fasteners that are tightenable within the one or more elongated slots in order to maintain a disposition of the first rail half relative to the second rail half and thereby maintain the telescoping length of each of the telescoping rails.

10. The rack-mounted equipment system of claim 9, wherein rough adjustments of the telescoping length of each of the telescoping rails is achievable by removing the locking fasteners and adjusting the disposition of the second rail half relative to the first rail half, and wherein fine adjustments of the telescoping length of each of the telescoping rails may be achieved by loosening the locking fasteners and slightly adjusting the disposition of the second rail half relative to the first rail half.

11. The rack-mounted equipment system of claim 8, wherein the first rail half comprises one or more standoffs and the second rail half comprises a plurality of keyhole slots configured to receive the one or more standoffs in order to adjustably slide the second rail half relative to the first rail half.

12. The rack-mounted equipment system of claim 11, wherein the plurality of keyhole slots comprise an elongated portion and a portion comprising a diameter larger than a width of the elongated portion that is configured to receive the one or more standoffs.

13. A method for installing at least one equipment cradle in a rack-mounted equipment cabinet, the method comprising:

providing the at least one equipment cradle, the at least one equipment cradle comprising telescoping rails including a right rail and a left rail;

inserting at least one horizontal post disposed on each of front and rear endplates of the telescoping rails into holes disposed in each of front and rear rails of the rack-mounted equipment cabinet, such that the telescoping rails extend between the front and rear rails of the rack-mounted equipment cabinet; and mounting a first end of at least one cross brace to the left rail and a second end of the at least one cross brace to the right rail;

wherein each of the telescoping rails comprises a lower flange extending from an interior surface thereof, a in strut extending upwardly from each lower flange towards an interior of the equipment cradle, each in strut comprising one or more studs disposed thereon;

wherein mounting a first end of at least one cross brace to the left rail comprises securing the first end of the at least one cross brace to the one or more studs by one or more first fasteners, and mounting a second end of the at least one cross brace to the right rail comprises securing the second end of the at least one cross brace to the one or more studs by one or more second fasteners; and wherein the at least one cross brace is configured to support and distribute a load placed thereon between the telescoping rails.

14. The method of claim 13, further comprising adjusting a telescoping length of each telescoping rail between the front and rear rails of the rack-mounted equipment cabinet by sliding a second rail half of each telescoping rail relative to a first rail half.

15. The method of claim 14, further comprising receiving, in one or more elongated slots disposed on longitudinally extending flanges of the first rail half and the second rail half of each telescoping rail, locking fasteners that are tightenable within the one or more elongated slots in order to maintain a disposition of the first rail half relative to the second rail half and thereby maintain the telescoping length of each telescoping rail.

16. The method of claim 15, further comprising removing the locking fasteners and adjusting the disposition of the second rail half relative to the first rail half to achieve rough adjustments of the telescoping length of each telescoping rail, and loosening the locking fasteners and slightly adjusting the disposition of the second rail half relative to the first rail half to achieve fine adjustments of the telescoping length of each telescoping rail.

17. The method of claim 14, further comprising adjustably sliding one or more standoffs disposed in the first rail half comprises one or more standoffs within a plurality of keyhole slots disposed in the second rail half and configured to receive the one or more standoffs in order to adjustably slide the second rail half relative to the first rail half.

\* \* \* \* \*